United States Patent
Kajiyama et al.

(10) Patent No.: US 6,939,785 B2
(45) Date of Patent: Sep. 6, 2005

(54) PROCESS FOR MANUFACTURING A SEMICONDUCTOR CHIP

(75) Inventors: Keiichi Kajiyama, Tokyo (JP); Kentaro Odanaka, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 10/866,781

(22) Filed: Jun. 15, 2004

(65) Prior Publication Data

US 2004/0266138 A1 Dec. 30, 2004

(30) Foreign Application Priority Data

Jun. 24, 2003 (JP) ........................................ 2003-179550

(51) Int. Cl.$^7$ ............................................. H01L 21/301
(52) U.S. Cl. ..................................... 438/463; 438/928
(58) Field of Search ................................ 438/462, 463, 438/465, 928

(56) References Cited

U.S. PATENT DOCUMENTS

| | | | |
|---|---|---|---|
| 5,093,281 A | * | 3/1992 | Eshima ......................... 29/827 |
| 5,888,883 A | * | 3/1999 | Sasaki et al. ................ 438/460 |
| 6,337,258 B1 | * | 1/2002 | Nakayoshi et al. ......... 438/464 |
| 6,770,544 B2 | * | 8/2004 | Sawada ........................ 438/462 |

FOREIGN PATENT DOCUMENTS

JP 2000-118081 4/2000

* cited by examiner

Primary Examiner—Chandra Chaudhari
(74) Attorney, Agent, or Firm—Smith, Gambrell & Russell, LLP

(57) ABSTRACT

A process for manufacturing a semiconductor chip by dividing a semiconductor wafer having a plurality of streets formed in a lattice-like form on the front surface into individual semiconductor chips, and affixing an adhesive film for die bonding to the back surfaces of the individual semiconductor chips, comprising a dividing groove forming step for forming dividing grooves having a predetermined depth from the front surface of the semiconductor wafer along the streets; a protective member affixing step for affixing a protective member to the front surface having dividing grooves formed thereon of the semiconductor wafer; a dividing groove exposing step for exposing the dividing grooves to the back surface by grinding the back surface of the semiconductor wafer to divide the semiconductor wafer into individual semiconductor chips; an adhesive film affixing step for affixing the adhesive film to the back surfaces of the individually divided semiconductor chips; and an adhesive film cutting step for applying a laser beam to the adhesive film affixed on the back surfaces of the individually divided semiconductor chips from the front surface side of the adhesive film along the dividing grooves to cut the adhesive film along the dividing grooves.

5 Claims, 10 Drawing Sheets

PROCESS FOR MANUFACTURING A SEMICONDUCTOR CHIP

FIELD OF THE INVENTION

The present invention relates to a process for manufacturing a semiconductor chip by dividing a semiconductor wafer having a plurality of streets formed in a lattice-like form on the front surface and circuits formed in a plurality of areas sectioned by the plurality of streets, into individual semiconductor chips and affixing an adhesive film for die bonding to the back surfaces of the individual semiconductor chips.

DESCRIPTION OF THE PRIOR ART

In the production process of a semiconductor device, for example, individual semiconductor chips are manufactured by forming a circuit such as IC or LSI in a plurality of areas sectioned by streets (cutting lines) formed in a lattice-like form on the front surface of a substantially disk-like semiconductor wafer, and dividing the semiconductor wafer into the circuit formed areas along the streets. A dicing machine is generally used as a dividing machine for dividing the semiconductor wafer to cut the semiconductor wafer along the streets with a cutting blade having a thickness of about 20 $\mu$m. The thus obtained semiconductor chips are packaged and widely used in electric equipments such as mobile phones, personal computers or the like.

An adhesive film for die bonding called "die attach film", which has a thickness of 20 to 40 $\mu$m and is formed of a polyimide resin or the like, is affixed to the back surface of the above individually divided semiconductor chips, and the semiconductor chips are then bonded, by heating, to a frame for supporting the semiconductor chips via this adhesive film. As a method to affix the adhesive film for die bonding to the back surfaces of the semiconductor chips, the adhesive film is affixed to the back surface of the semiconductor wafer and the semiconductor wafer is put on a dicing tape via this adhesive film and then, the semiconductor wafer is cut together with the adhesive film along the streets formed on the front surface of the semiconductor wafer with a cutting blade, thereby forming the semiconductor chips having the adhesive film on the back surface thereof. When the semiconductor chips are bonded to a frame supporting the semiconductor chips, the bonding work is carried out smoothly because the adhesive film has been already affixed to the back surface of the semiconductor chips.

In recent years, lighter and smaller electric equipment such as mobile phones and personal computers are in growing demand and therefore, thinner semiconductor chips are desired. A dividing technique so called "pre-dicing" is already practically used as a technique to divide a semiconductor wafer into thinner semiconductor chips. In this pre-dicing technique, dividing grooves having a predetermined depth (corresponding to the final thickness of each semiconductor chip) are formed on the front surface of the semiconductor wafer along the streets and then, the back surface of the semiconductor wafer having the dividing grooves formed on the front surface is ground to allow the back surface to be exposed to divide the semiconductor wafer into individual semiconductor chips. This technique makes it possible to process each semiconductor chip to a thickness of 50 $\mu$m or less.

However, when the semiconductor wafer is divided into individual semiconductor chips by the pre-dicing technique, after the dividing grooves having a predetermined depth are formed on the front surface of the semiconductor wafer along the streets, the back surface of the semiconductor wafer is ground to expose the dividing grooves to the back surface. The adhesive film for die bonding, therefore, cannot be affixed onto the back surface of the semiconductor wafer beforehand. Accordingly, to bond the semiconductor chips to the frame for supporting the semiconductor chips according to the pre-dicing technique, the bonding work must be conducted while a bonding agent is being inserted between the semiconductor chips and the frame. This poses a problem making it impossible to carry out the bonding work smoothly.

To solve the above problem, JP-A 2000-118081 discloses a process for manufacturing a semiconductor chip by affixing an adhesive film for die bonding to the back surfaces of individually divided semiconductor chips obtained by pre-dicing a semiconductor wafer, affixing the semiconductor chips on a dicing tape via this adhesive film and then, applying a laser beam to the portions of the adhesive film exposed to spaces between adjacent semiconductor chips through the spaces from the front surface side of the semiconductor chips to remove the portions exposed to the spaces between adjacent semiconductor chips of the adhesive film.

The technology disclosed by JP-A 2000-118081 is to apply a laser beam to dividing grooves formed with a cutting blade having a thickness of about 20 $\mu$m from the front surface side of the semiconductor chips to cut the portions exposed at the spaces between adjacent semiconductor chips of the adhesive film. However, it is difficult to cut only the adhesive film without applying a laser beam to the front surfaces of the semiconductor chips. Therefore, in the semiconductor chip manufacturing process disclosed by the above publication, the front surfaces of the semiconductor chips having a circuit formed thereon might have damage by the laser beam.

SUMMARY OF THE INVENTION

It is an object of the present invention to provide a semiconductor chip manufacturing process which enables an adhesive film for die bonding to be affixed to the back surface of semiconductor chips easily without damaging the front surface of the individual semiconductor chips obtained by dividing a semiconductor wafer by pre-dicing.

To attain the above object, according to the present invention, there is provided a process for manufacturing a semiconductor chip by dividing a semiconductor wafer having a plurality of streets formed in a lattice-like form on the front surface and circuits formed in a plurality of areas sectioned by the plurality of streets into individual semiconductor chips, and affixing an adhesive film for die bonding to the back surfaces of the individual semiconductor chips, comprising:

a dividing groove forming step for forming dividing grooves having a predetermined depth from the front surface of the semiconductor wafer along the streets;

a protective member affixing step for affixing a protective member to the front surface having dividing grooves formed thereon of the semiconductor wafer;

a dividing groove exposing step for exposing the dividing grooves to the back surface by grinding the back surface of the semiconductor wafer to divide the semiconductor wafer into individual semiconductor chips;

an adhesive film affixing step for affixing the adhesive film to the back surfaces of the individually divided semiconductor chips; and an adhesive film cutting step for applying a laser beam to the adhesive film affixed on the back surfaces of the individually divided semiconductor chips from the front surface side of the adhesive film along the dividing grooves to cut the adhesive film along the dividing grooves.

Further, according to the present invention, there is also provided a process for manufacturing a semiconductor chip by dividing a semiconductor wafer having a plurality of streets formed in a lattice-like form on the front surface and circuits formed in a plurality of areas sectioned by the plurality of streets into individual semiconductor chips, and affixing an adhesive film for die bonding to the back surfaces of the individual semiconductor chips, comprising:

a dividing groove forming step for forming dividing grooves having a predetermined depth from the front surface of the semiconductor wafer along the streets;

a protective member affixing step for affixing a protective member to the front surface having dividing grooves formed thereon of the semiconductor wafer;

a dividing groove exposing step for exposing the dividing grooves to the back surface by grinding the back surface of the semiconductor wafer, and dividing the semiconductor wafer into individual semiconductor chips;

an adhesive film affixing step for affixing the adhesive film to the back surfaces of the individually divided semiconductor chips;

an adhesive film cutting step for applying a laser beam to the adhesive film affixed on the back surfaces of the individually divided semiconductor chips from the front surface side of the adhesive film along the dividing grooves to cut the adhesive film along the dividing grooves, a dicing tape affixing step for affixing the adhesive film sides of the individually divided semiconductor chips having the cut adhesive film affixed thereto onto a dicing tape and removing the protective member affixed to the front surfaces of the individually divided semiconductor chips; and a semiconductor chip pick-up step for picking up the semiconductor chips having the adhesive film affixed thereto from the dicing tape.

The above adhesive film affixing step is carried out by placing the adhesive film on the back surface of the semiconductor wafer divided into semiconductor chips and pressing the adhesive film against the back surface of the semiconductor wafer under heating at 80 to 200° C. to affix it. Since the adhesive force of the above dicing tape is reduced by an external stimulus, an external stimulus is desirably exerted on the dicing tape to reduce its adhesive force when the semiconductor chips having the adhesive film affixed thereto are picked up from the dicing tape in the semiconductor chip pick-up step.

BRIEF DESCRIPTION

DETAILED DESCRIPTION OF THE PREFERRED EMBODIMENT

A preferred embodiment of the semiconductor chip manufacturing process according to the present invention will be described in detail hereinbelow with reference to the accompanying drawings.

Figure 1:
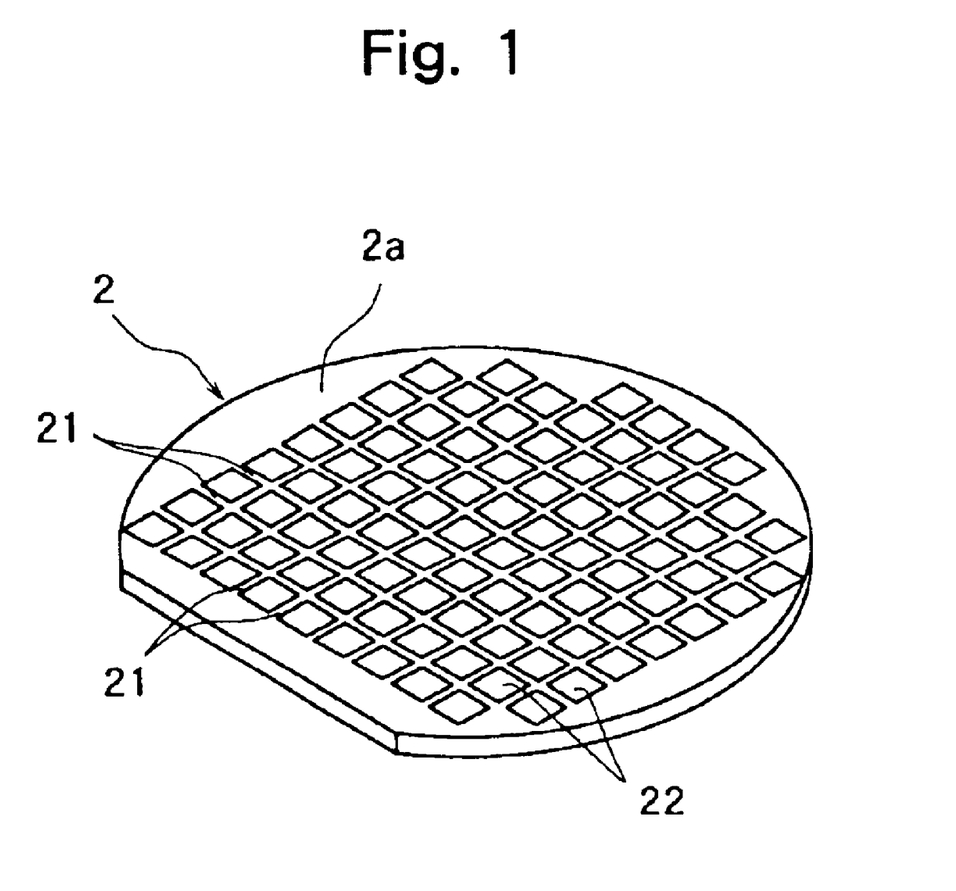
FIG. 1 is a perspective view of a semiconductor wafer to be divided by the semiconductor chip manufacturing process according to the present invention.
Figure 2:
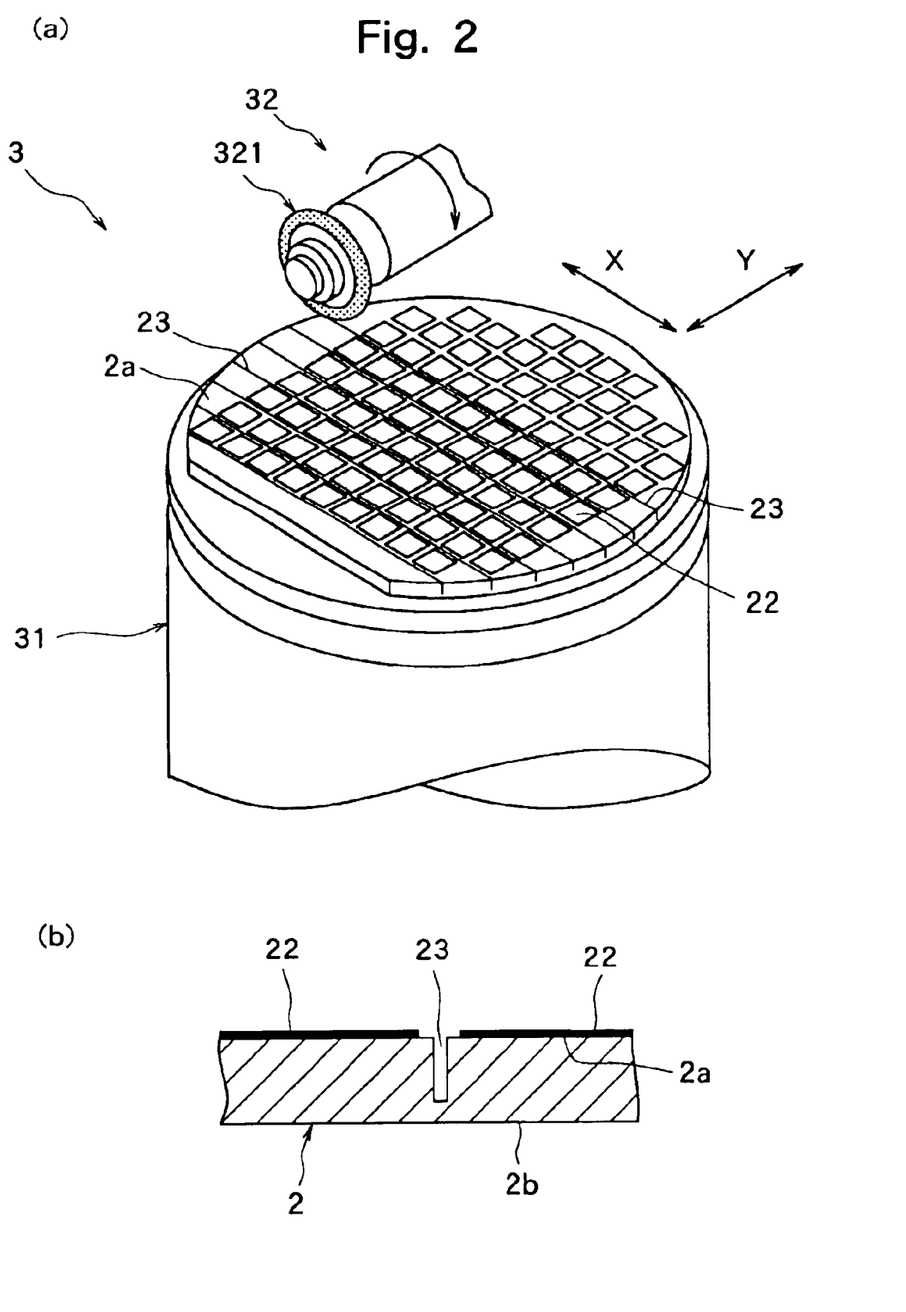
FIGS. 2(a) and 2(b) are diagrams for explaining the dividing groove forming step in the semiconductor chip manufacturing process according to the present invention.
Figure 3:
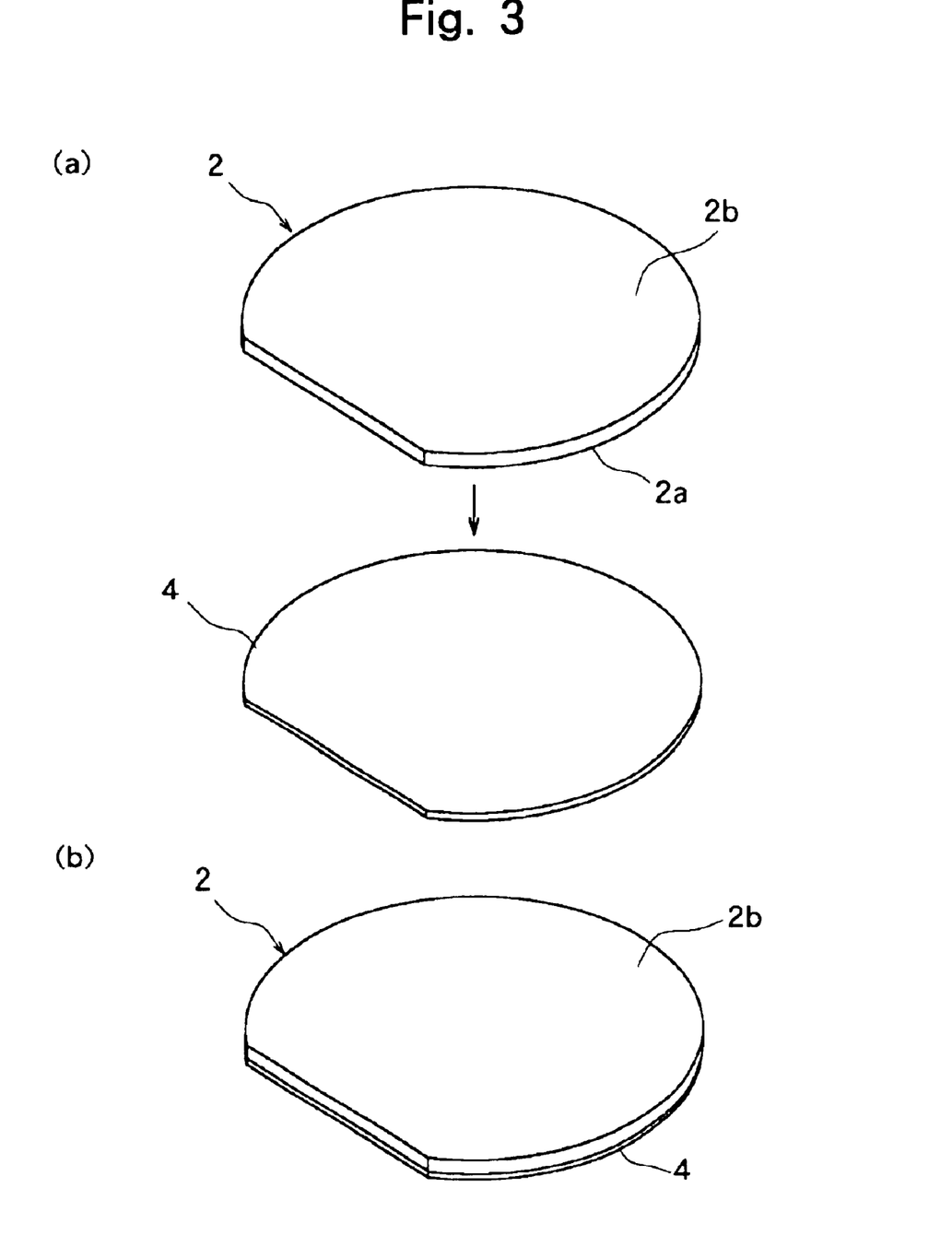
FIGS. 3(a) and 3(b) are diagrams for explaining the protective member affixing step in the semiconductor chip manufacturing process according to the present invention.
Figure 4:
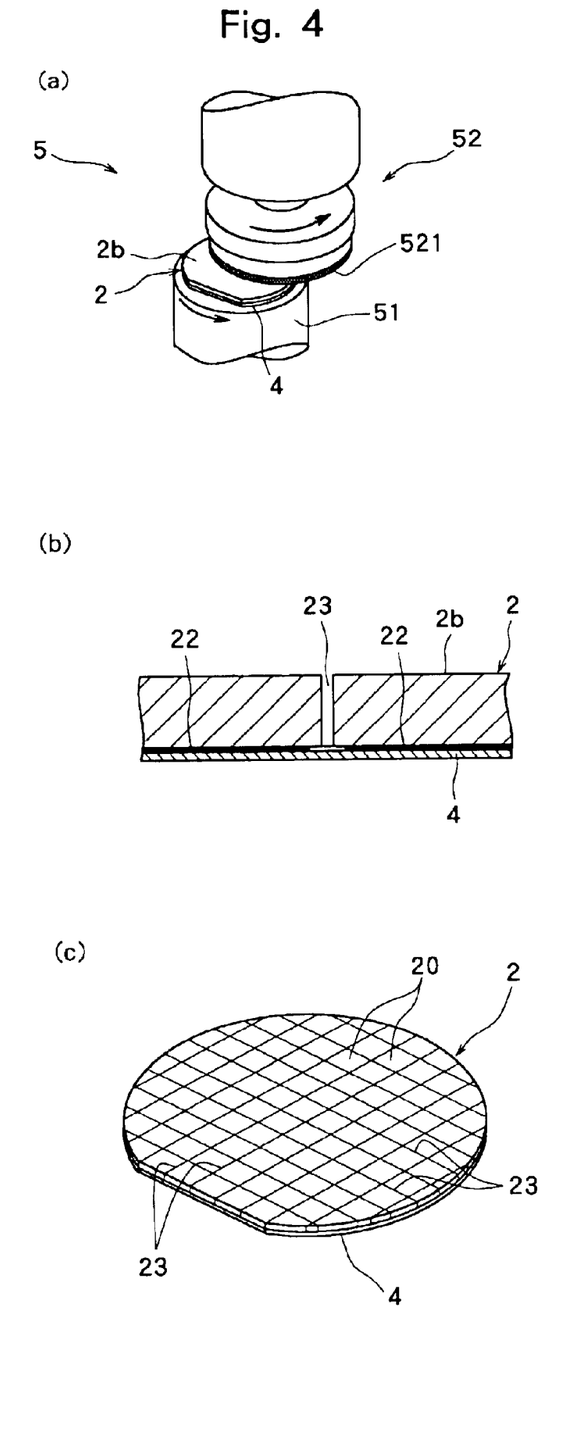
FIGS. 4(a) to 4(c) are diagrams for explaining the dividing groove exposing step in the semiconductor chip manufacturing process according to the present invention.
Figure 5:
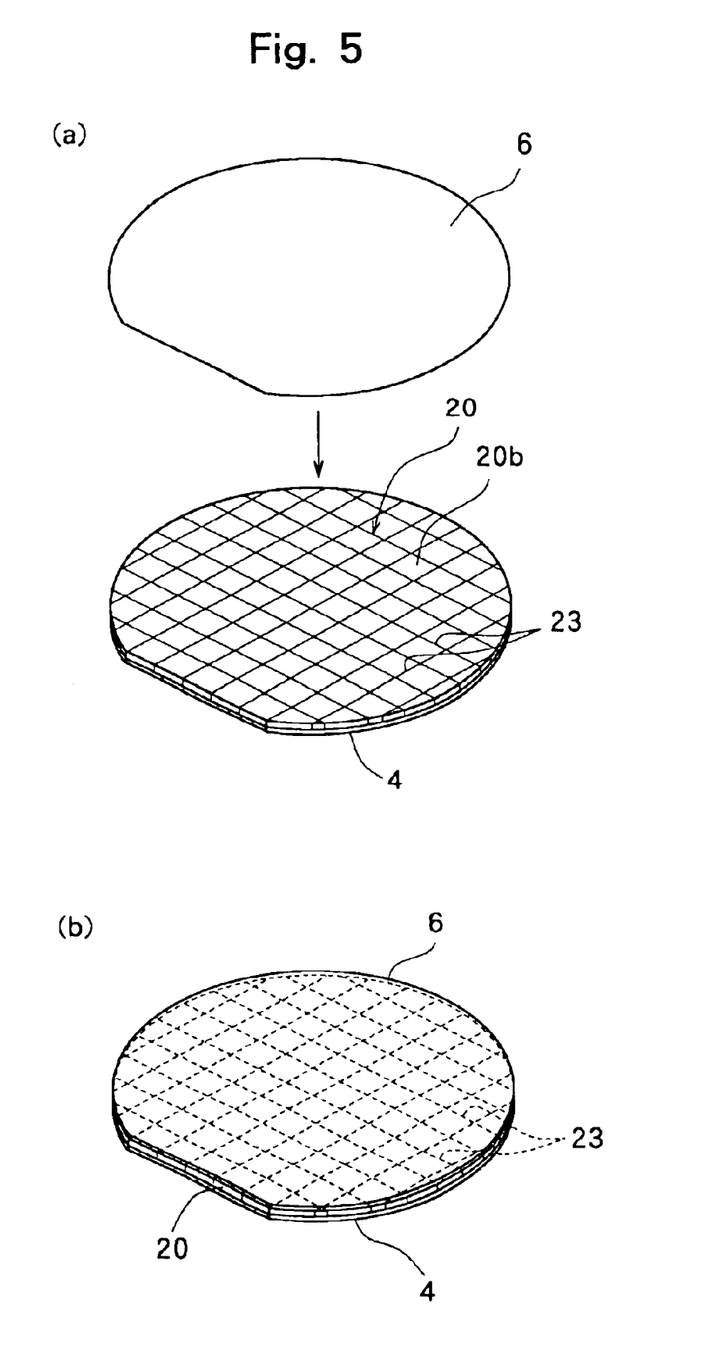
FIGS. 5(a) and 5(b) are diagrams for explaining the adhesive film affixing step in the semiconductor chip manufacturing process according to the present invention.
Figure 6:
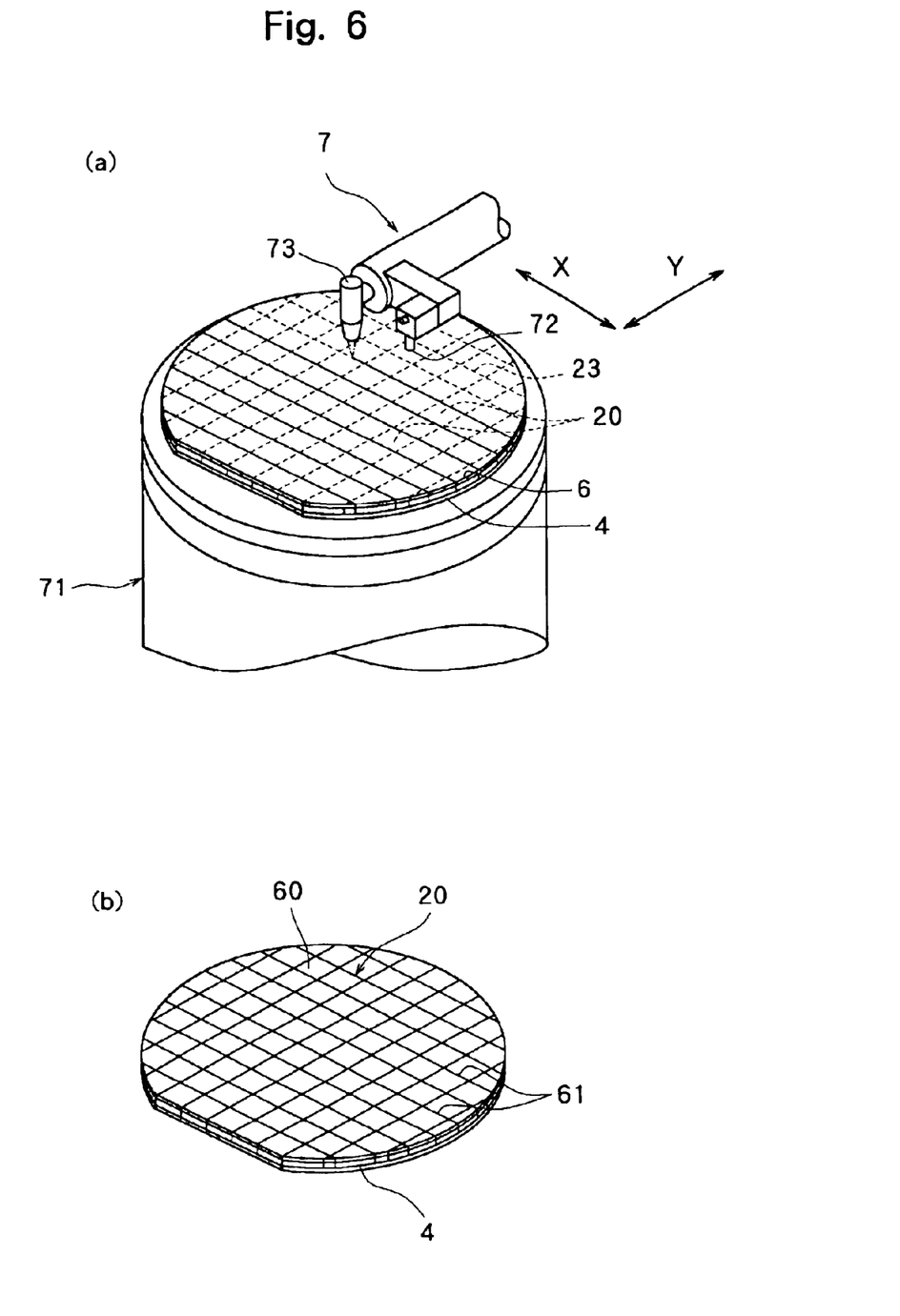
FIGS. 6(a) and 6(b) are diagrams for explaining the adhesive film cutting step in the semiconductor chip manufacturing process according to the present invention.

FIG. 1 is a perspective view of a semiconductor wafer to be divided according to the present invention. The semiconductor wafer 2 shown in FIG. 1 has a plurality of streets 21 formed in a lattice-like form on the front surface 2a and circuits 22 formed in a plurality of areas sectioned by the plurality of streets 21. The process for manufacturing semiconductor chips by dividing this semiconductor wafer 2 into individual semiconductor chips will be described with reference to FIGS. 2 to 10.

To divide the semiconductor wafer 2 into individual semiconductor chips, dividing grooves having a predetermined depth (corresponding to the final thickness of each semiconductor chip) are first formed along the streets 21 formed on the front surface 2a of the semiconductor wafer 2 (dividing groove forming step). A cutting machine 3 that is commonly used as a dicing machine shown in FIG. 2(a) may be used in this dividing groove forming step. That is, the cutting machine 3 comprises a chuck table 31 having a suction-holding means and a cutting means 32 having a cutting blade 321. The semiconductor wafer 2 is held on the chuck table 31 of this cutting machine 3 in such a manner that the front surface 2a of the semiconductor wafer 2 faces up, and the chuck table 31 is fed in a direction indicated by an arrow X while the cutting blade 321 of the cutting means 32 is rotated to form a dividing groove 23 along a street 21 extending in a predetermined direction. The dividing groove 23 is set to have a depth corresponding to the final thickness of each semiconductor chip to be divided, as shown in FIG. 2(b). After the dividing groove 23 is thus formed along the street 21 extending in the predetermined direction, the cutting means 32 is-indexing-fed by the interval between adjacent streets 21 in a direction indicated by an arrow Y, and the semiconductor wafer 2 is cutting-fed again. After the above cutting-feeding and indexing-feeding are carried out for all the streets extending in the predetermined direction, the chuck table 31 is turned at 90° to carry out the above cutting-feeding and indexing-feeding for streets extending in a direction perpendicular to the above predetermined direction, whereby the dividing grooves 23 are formed along all the streets formed on the semiconductor wafer 2.

After the dividing grooves 23 having a predetermined depth are formed along the streets 21 on the front surface 2a of the semiconductor wafer 2 in the above dividing groove forming step, a protective member 4 for grinding is affixed to the front surface 2a (surface having circuit 22 formed thereon) of the semiconductor wafer 2 as shown in FIG. 3(a) and FIG. 3(b) (protective member affixing step).

Thereafter, the back surface 2b of the semiconductor wafer 2 having the protective member 4 affixed to the front surface 2a is ground to expose the dividing grooves 23 to the back surface 2b, and the semiconductor wafer 2 is divided into individual semiconductor chips (dividing groove exposing step). This dividing groove exposing step is carried out by a grinding device 5 having a chuck table 51 and a grinding means 52 having a grinding stone 521 as shown in FIG. 4(a). That is, the semiconductor wafer 2 with the back surface 2b facing up is held on the chuck table 51 and the grinding stone 521 of the grinding means 52 is rotated at 6,000 rpm and brought into contact with the back surface 2b of the semiconductor wafer 2b while the chuck table 51 is rotated at, for example, 300 rpm to grind the back surface 2b until the dividing grooves 23 are exposed to the back surface 2b as shown in FIG. 4(b). By thus grinding the semiconductor wafer 2 until its dividing grooves 23 are exposed, the semiconductor wafer 2 is divided into individual semiconductor chips 20 as shown in FIG. 4(c). Since the obtained semiconductor chips 20 have the protective member 4 affixed to the front surfaces, they do not fall apart and maintain the shape of the semiconductor wafer 2.

After the semiconductor wafer 2 is divided into the individual semiconductor chips 20 in the above dividing groove exposing step, an adhesive film 6 for die bonding called "die attach film" is affixed to the back surfaces 20b of the semiconductor chips 20 maintaining the shape of the semiconductor wafer as shown in FIGS. 5(a) and 5(b) (adhesive film affixing step). This adhesive film affixing step is carried out by placing the adhesive film 6 made of a polyimide resin and having a thickness of 20 to 40 μm on the back surfaces 20b of the individual semiconductor chips 20 maintaining the shape of the semiconductor wafer and pressing it against the back surfaces 20b of the semiconductor chips 20 under heating at 80 to 200° C. to affix it. Since the adhesive film 6 is affixed to the back surfaces 20b of the individual semiconductor chips 20 maintaining the shape of the semiconductor wafer 2 as described above, it can be easily affixed to the back surfaces 20b of the semiconductor chips 20.

After the adhesive film 6 is affixed to the back surfaces 20b of the individual semiconductor chips 20 maintaining the shape of the semiconductor wafer in the above adhesive film affixing step, a laser beam is applied to the adhesive film 6 from the front surface side thereof along the above dividing grooves 23 to carry out the adhesive film cutting step for cutting the adhesive film 6 along the dividing grooves 23. This adhesive film cutting step is carried out by a laser beam processing machine 7 shown in FIG. 6(a). That is, the individual semiconductor chips 20 maintaining the shape of the semiconductor wafer are held on the chuck table 71 of the laser beam processing machine 7 with the adhesive film 6 facing up, and positioned right below an image pick-up means 72. Image treatment such as pattern matching for aligning a laser beam application means 73 with the above dividing groove 23 is carried out by the image pick-up means 72 and a control means (not shown) to carry out the alignment of a laser beam application position. On this occasion, when the adhesive film 6 affixed to the back surfaces 20b of the semiconductor chips 20 individually divided is not transparent and the dividing groove 23 cannot be seen, the dividing groove 23 can be image-picked up through the adhesive film 6 by using an image pick-up means comprising an infrared illuminating means, an optical system for capturing infrared radiation and an image pick-up device (infrared CCD) for outputting an electric signal corresponding to the infrared radiation as the image pick-up means 72.

After the alignment of the laser beam application position is carried out as described above, the chuck table 71 is moved to a laser beam application area where the laser beam application means 73 is located, and fed in the direction indicated by the arrow X while a laser beam is applied from the laser beam application means 73 with its focusing point on the front surface of the adhesive film 6. As a result, the adhesive film 6 is cut along the dividing groove 23 by the energy of the laser beam to form a cutting line 61. After the cutting line 61 is formed along the dividing groove 23 in the predetermined direction, the chuck table 71 is indexing-fed by the interval between the dividing grooves 23 in the direction indicated by the arrow Y and fed again. After the cutting-feeding and indexing-feeding are carried out for all the dividing grooves 23 formed in the predetermined direction, the chuck table 71 is turned at 90° to carry out the above cutting-feeding and indexing-feeding for dividing grooves formed in a direction perpendicular to the above predetermined direction to divide the adhesive film 6 into adhesive films 60 affixed to the respective semiconductor chips 20 as shown in FIG. 6(b). Since the laser beam is applied to the front surface of the adhesive film 6 affixed to the back surfaces 20b of the individual semiconductor chips 20 in this adhesive film cutting step, the circuit formed front surfaces 20a of the semiconductor chips 20 are not damaged by the laser beam. Since the protective member 4 is affixed onto the front surfaces 20a of the semiconductor chips 20, when the adhesive film 6 affixed to the back surfaces 20b of the individual semiconductor chips 20 is divided into the adhesive films 60 for the respective semiconductor chips 20 as described above, the semiconductor chips 20 do not fall apart and maintain the shape of the semiconductor wafer 2.

Figure 7:
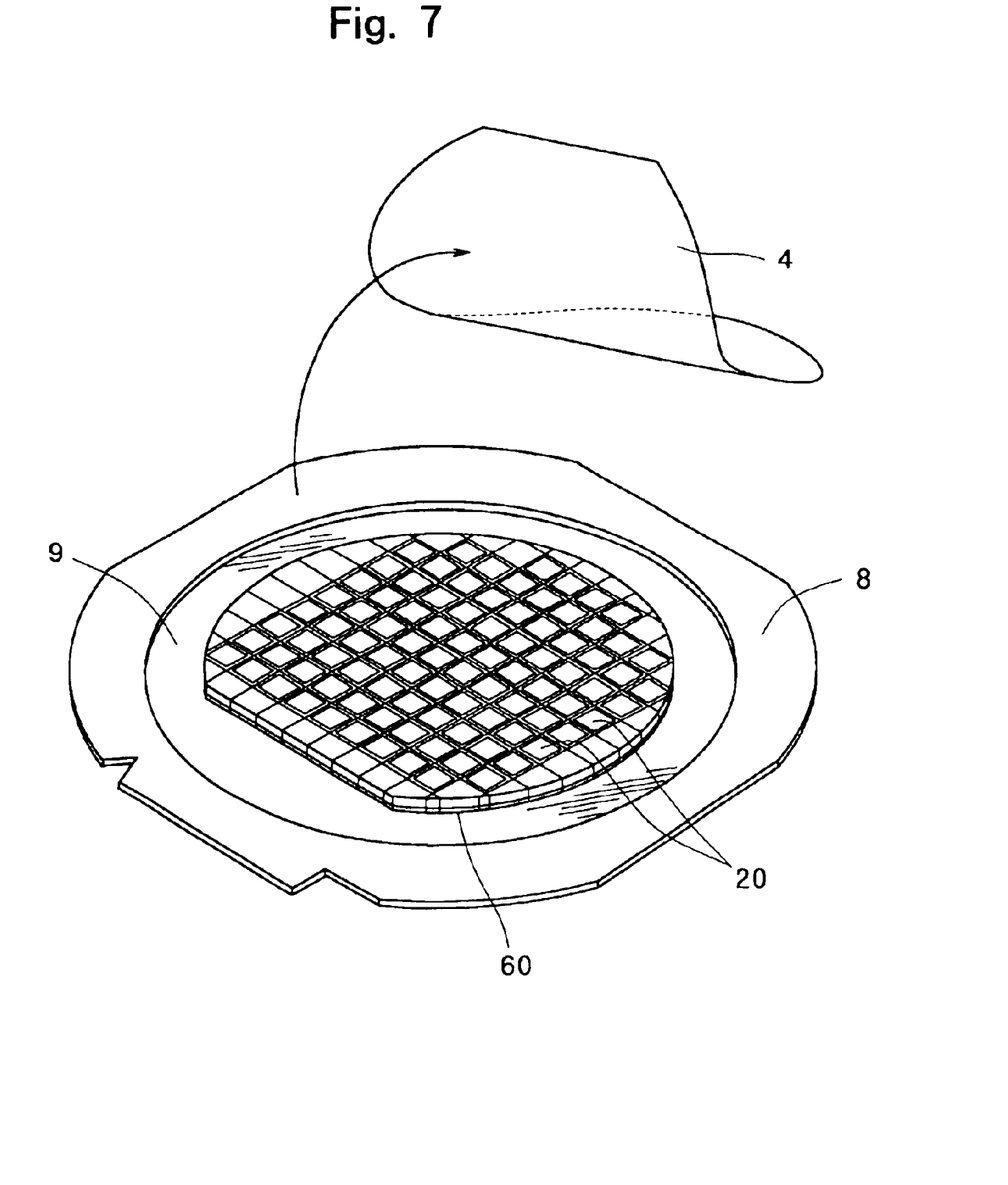
FIG. 7 is a diagram for explaining the dicing tape affixing step in the semiconductor chip manufacturing process according to the present invention.

Then, the dicing tape affixing step in which the adhesive film 60 sides of the individually divided semiconductor chips 20 maintaining the shape of the semiconductor wafer are put on a dicing tape and the protective member 4 affixed to the front surfaces of the individually divided semiconductor chips 20 is removed is carried out. In this dicing tape affixing step, the individually divided semiconductor chips 20 maintaining the shape of the semiconductor wafer 2 are affixed onto the top surface of the elastic dicing tape 9 such as a vinyl chloride tape, which is arranged to cover the inner opening of an annular support frame 8 as shown in FIG. 7, in such a manner that the cut adhesive film 60 sides of each of the semiconductor chips 20 come into contact with the top surface of the dicing tape 9. And, the protective member 4 affixed to the front surfaces 20a of the individually divided semiconductor chips 20 is removed. An UV tape whose adhesive strength is reduced by an external stimulus such as ultraviolet radiation, is used as the dicing tape 9.

After the above dicing tape affixing step is carried out, the semiconductor chip pick-up step for picking up the semiconductor chips 20 having the adhesive film 60 affixed thereto from the dicing tape 9 is carried out. This semiconductor chip pick-up step is carried out by a pick-up device 10 shown in FIG. 8 and FIGS. 9(a) and 9(b). The pick-up device 10 will be described hereinbelow. The illustrated pick-up device 10 comprises a cylindrical base 11 having a placing surface 111 for placing the above support frame 8 and an expansion means 12 that is arranged in the base 11 concentrically and works for pressing the dicing tape 9 affixed to the support frame 8. This expansion means 12 has a cylindrical expansion member 121 for supporting an area 91 where the plurality of semiconductor chips 20 in the dicing tape 9 are existent. This expansion member 121 can be moved between a standard position shown in FIG. 9(*a*) and an expansion position shown in FIG. 9(*b*) above the standard position in the vertical direction (axial direction of the cylindrical base 11) by a lifting means (not shown) In the illustrated embodiment, ultraviolet lamps 113 are installed in the expansion member 121.

The semiconductor removing step using the above pick-up device 10 will be described with reference to FIG. 8 and FIGS. 9(*a*) and 9(*b*).

Figure 8:
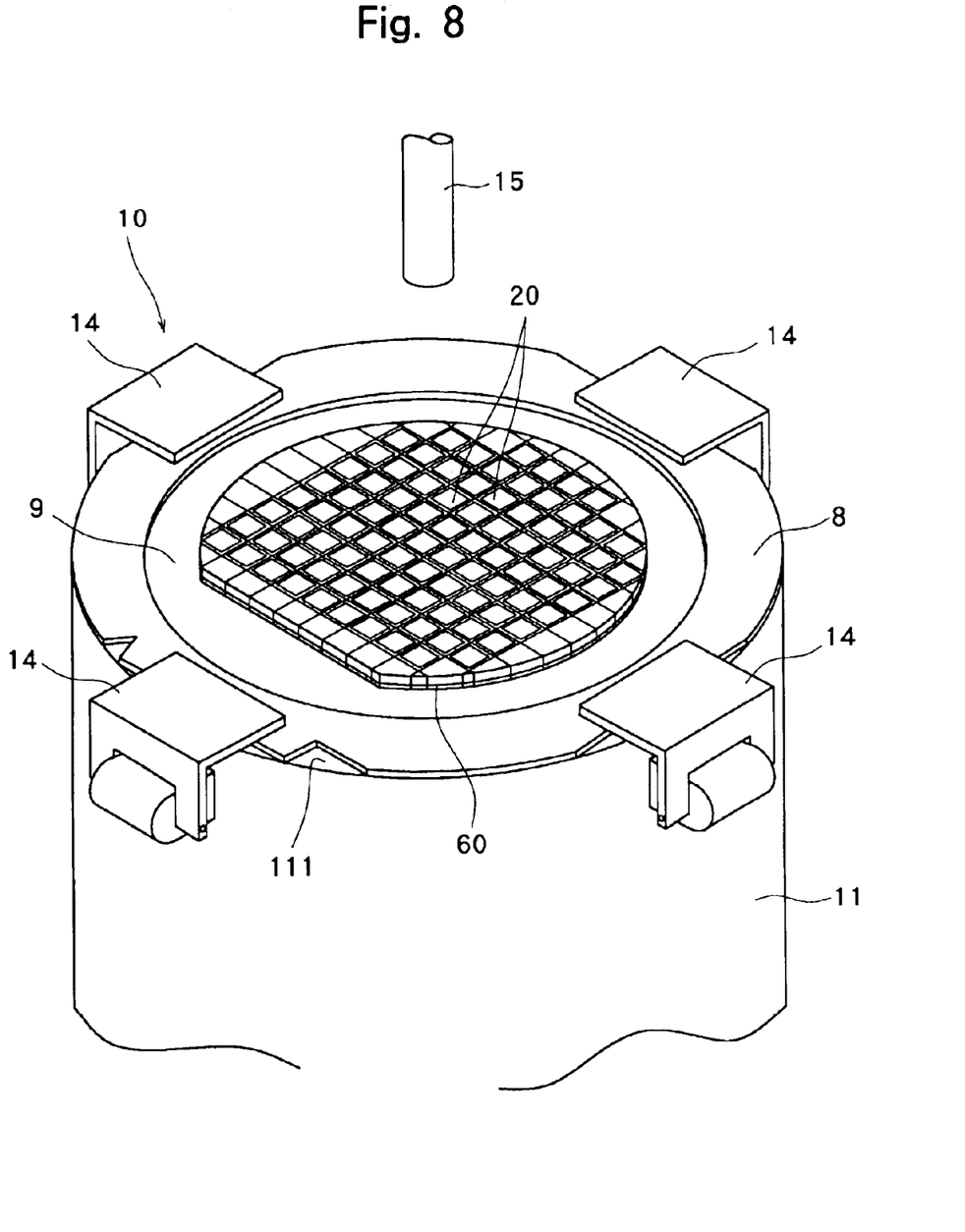
FIG. 8 is a perspective view of a pick-up device for carrying out the semiconductor chip pick-up step in the semiconductor chip manufacturing process according to the present invention.
Figure 9:
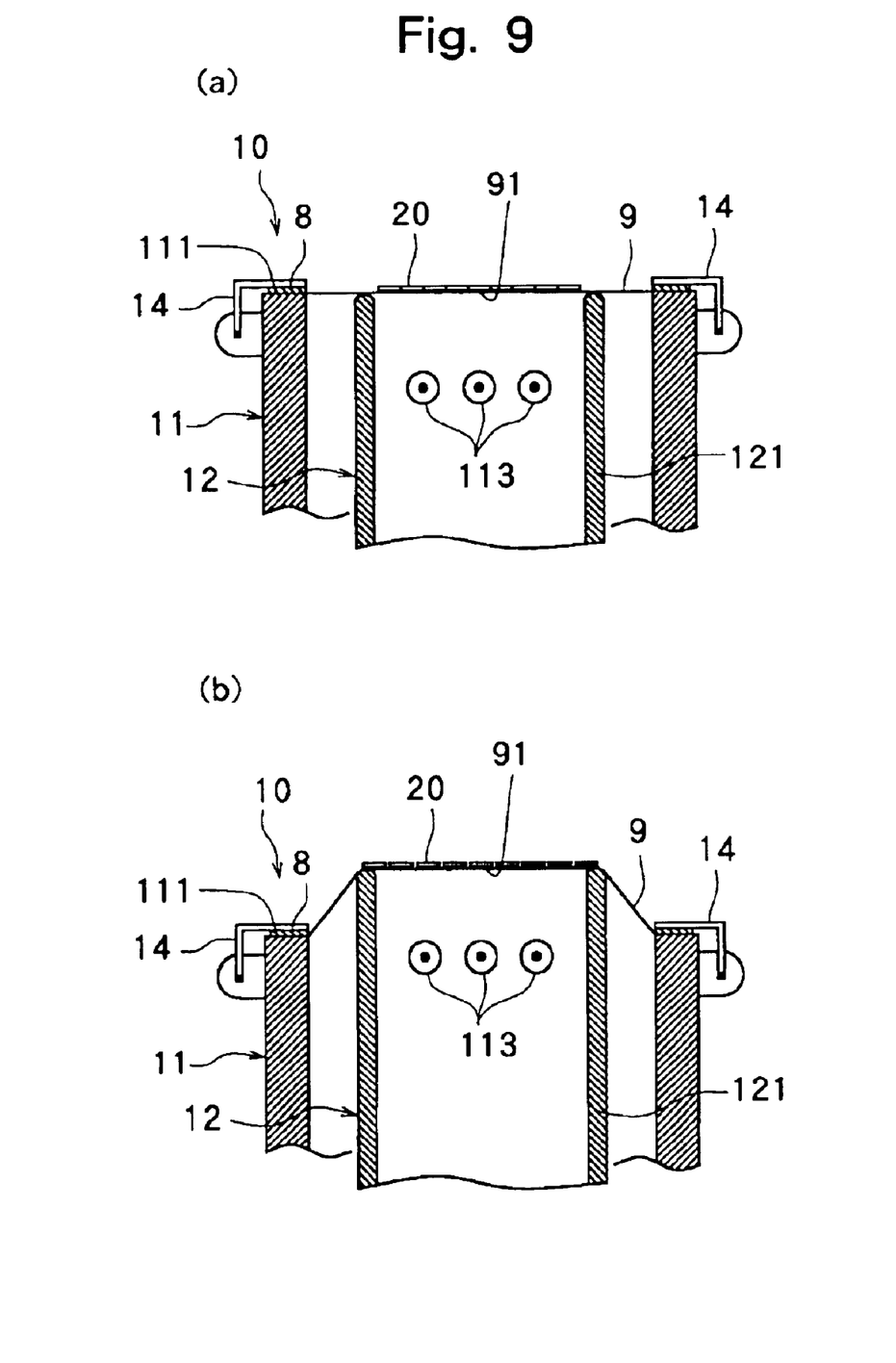
FIGS. 9(a) and 9(b) are diagrams for explaining the semiconductor chip pick-up step in the semiconductor chip manufacturing process according to the present invention.

The plurality of semiconductor chips 20 supported on the top surface of the elastic dicing tape 9 affixed to the support frame 8 (the side of the adhesive films 60 affixed onto the back surfaces of the semiconductor chips 20 are put on the top surface of the dicing tape 9) as described above are placed on the placing surface 111 of the cylindrical base 11 as shown in FIG. 8 and FIG. 9(*a*) and secured onto the base 11 by clamps 14. As shown in FIG. 9(*b*), then, the expansion member 121 of the expansion means 12 which supports the area 91 where the plurality of semiconductor chips 20 in the above dicing tape 9 are existent is moved from the standard position shown in FIG. 9(*a*) to the expansion position shown in FIG. 9(*b*) by the lifting means (not shown). As a result, the elastic dicing tape 9 is expanded, thereby forming a gap between the dicing tape 9 and the adhesive films 60 affixed onto the semiconductor chips 20 to reduce adhesion. Therefore, the semiconductor chips 20 having the adhesive film 60 can be easily removed from the dicing tape 9 and a space is formed between each semiconductor chip 20 and the adhesive film 60 affixed to the semiconductor chip 20.

Figure 10:
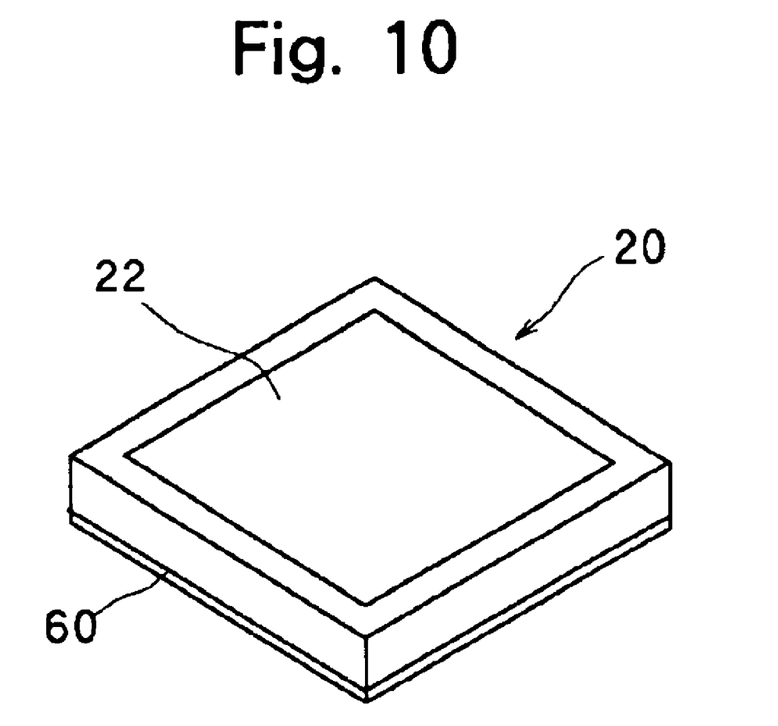
FIG. 10 is a perspective view of a semiconductor chip formed by the semiconductor chip manufacturing process according to the present invention.

Thereafter, each semiconductor chip 20 is removed from the top surface of the dicing tape 9 by operating a pick-up collet 15 positioned above the pick-up device 10 and carried to a tray (not shown) as shown in FIG. 8. At this point, the ultraviolet lamps 113 installed in the expansion member 121 are turned on to apply ultraviolet radiation to the dicing tape 9 so as to reduce the adhesive strength of the dicing tape 9, thereby making it easier to pick up the semiconductor chip 20. The semiconductor chip 20 thus picked-up from the dicing tape 9 is a state of the adhesive film 60 being affixed onto the back surface as shown in FIG. 10 and hence, there can be obtained the semiconductor chip 20 having the adhesive film 60 affixed onto the back surface.

According to the semiconductor chip manufacturing process of the present invention, in the semiconductor wafer divided into individual semiconductor chips by pre-dicing, since the adhesive film for die bonding is affixed to the back surfaces of the semiconductor chips in a state of maintaining the shape of the semiconductor wafer, the adhesive film can be easily affixed to the back surfaces of the semiconductor chips. In the present invention, a laser beam is applied to the adhesive film affixed to the back surfaces of the individually divided semiconductor chips from the side of the front surface of the adhesive film along the dividing grooves to cut the adhesive film every semiconductor chip. Therefore, the front surfaces (circuit surfaces) of the semiconductor chips are not exposed to the laser beam and hence, are not damaged.

What is claimed is:

1. A process for manufacturing a semiconductor chip by dividing a semiconductor wafer having a plurality of streets formed in a lattice-like form on the front surface and circuits formed in a plurality of areas sectioned by the plurality of streets into individual semiconductor chips, and affixing an adhesive film for die bonding to the back surfaces of the individual semiconductor chips, comprising:

a dividing groove forming step for forming dividing grooves having a predetermined depth from the front surface of the semiconductor wafer along the streets;

a protective member affixing step for affixing a protective member to the front surface having dividing grooves formed thereon of the semiconductor wafer;

a dividing groove exposing step for exposing the dividing grooves to the back surface by grinding the back surface of the semiconductor wafer to divide the semiconductor wafer into individual semiconductor chips;

an adhesive film affixing step for affixing the adhesive film to the back surfaces of the individually divided semiconductor chips; and an adhesive film cutting step for applying a laser beam to the adhesive film affixed on the back surfaces of the individually divided semiconductor chips from the front surface side of the adhesive film along the dividing grooves to cut the adhesive film along the dividing grooves.

2. The process for manufacturing a semiconductor chip according to claim 1, wherein the adhesive film affixing step is carried out by placing the adhesive film on the back surfaces of the individually divided semiconductor chips, and pressing the adhesive film against the back surfaces of the individually divided semiconductor chips under heating at 80 to 200° C. to affix them.

3. A process for manufacturing a semiconductor chip by dividing a semiconductor wafer having a plurality of streets formed in a lattice-like form on the front surface and circuits formed in a plurality of areas sectioned by the plurality of streets into individual semiconductor chips and affixing an adhesive film for die bonding to the back surfaces of the individual semiconductor chips, comprising:

a dividing groove forming step for forming dividing grooves having a predetermined depth from the front surface of the semiconductor wafer along the streets;

a protective member affixing step for affixing a protective member to the front surface having dividing grooves formed thereon of the semiconductor wafer;

a dividing groove exposing step for exposing the dividing grooves to the back surface by grinding the back surface of the semiconductor wafer to divide the semiconductor wafer into individual semiconductor chips;

an adhesive film affixing step for affixing the adhesive film to the back surfaces of the individually divided semiconductor chips;

an adhesive film cutting step for applying a laser beam to the adhesive film affixed on the back surfaces of the individually divided semiconductor chips from the front surface side of the adhesive film along the dividing grooves to cut the adhesive film along the dividing grooves;

a dicing tape affixing step for affixing the adhesive film sides of the individually divided semiconductor chips having the cut adhesive film affixed thereto onto a dicing tape and removing the protective member affixed to the front surfaces of the individually divided semiconductor chips; and a semiconductor chip pick-up step for picking up the semiconductor chips having the adhesive film affixed thereto from the dicing tape.

4. The process for manufacturing a semiconductor chip according to claim 3, wherein the adhesive film affixing step is carried out by placing the adhesive film on the back surfaces of the individually divided semiconductor chips and pressing the adhesive film against the back surfaces of the individually divided semiconductor chips under heating at 80 to 200° C. to affix them.

5. The process for manufacturing a semiconductor chip according to claim 3, wherein the dicing tape has a property that its adhesive force is reduced by an external stimulus, and an external stimulus is exerted on the dicing tape to reduce the adhesive force thereof when the semiconductor chips having the adhesive film affixed thereto are picked up from the dicing tape in the semiconductor chip pick-up step.

* * * * *